(12) United States Patent
Gellrich et al.

(10) Patent No.: US 10,809,636 B2
(45) Date of Patent: Oct. 20, 2020

(54) OPTICAL ARRANGEMENT, IN PARTICULAR LITHOGRAPHY SYSTEM

(71) Applicant: Carl Zeiss SMT GmbH, Oberkochen (DE)

(72) Inventors: Bernhard Gellrich, Aalen (DE); Ralf Zweering, Aalen (DE); Charles Seviour, Aalen-Wasseralfingen (DE); Michael Erath, Dietenheim (DE); Jens Prochnau, Oberkochen (DE); Marwène Nefzi, Ulm (DE); Viktor Kulitzki, Zwickau (DE); Axel Lorenz, Meissen (DE); Stefan Schaff, Ellwangen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/513,201

(22) Filed: Jul. 16, 2019

(65) Prior Publication Data
US 2019/0339626 A1  Nov. 7, 2019

Related U.S. Application Data

(63) Continuation of application No. PCT/EP2017/079074, filed on Nov. 13, 2017.

(30) Foreign Application Priority Data

Jan. 17, 2017  (DE) .......... 10 2017 200 635

(51) Int. Cl.
*G03B 27/42* (2006.01)
*G03F 7/20* (2006.01)

(52) U.S. Cl.
CPC ...... *G03F 7/70825* (2013.01); *G03F 7/70258* (2013.01); *G03F 7/70316* (2013.01); *G03F 7/70958* (2013.01); *G03F 7/70975* (2013.01)

(58) Field of Classification Search
CPC .. G03F 7/70825; G03F 7/70975; G03F 7/709; G03F 7/70833; G03F 7/70725;
(Continued)

(56) References Cited

U.S. PATENT DOCUMENTS 6,556,364 B2 * 4/2003 Meehan ............... G02B 7/023
355/53
2002/0043081 A1  4/2002 Bowden et al.
(Continued)

FOREIGN PATENT DOCUMENTS

DE         101 40 608 A1    3/2003
DE   10 2007 063 305 A1    7/2009
(Continued)

OTHER PUBLICATIONS

Translation of International Preliminary Report on Patentability for corresponding PCT Appl No. PCT/EP2017/079074, dated Aug. 1, 2019.

(Continued)

*Primary Examiner* — Mesfin T Asfaw
(74) *Attorney, Agent, or Firm* — Fish & Richardson P.C.

(57) ABSTRACT

An optical arrangement, in particular a lithography system, includes: a movable component, in particular a mirror; at least one actuator for moving the component; and at least one stop having a stop face for delimiting the movement of the component. The optical arrangement further includes, on a stop or on a plurality of stops, at least two stop faces for delimiting the movement of the movable component in one and the same movement direction.

20 Claims, 2 Drawing Sheets

(58) Field of Classification Search
CPC ...... G03F 7/20; H04N 5/2254; H04N 5/2253; H04N 5/23287; G02B 7/1828; F16M 11/20
See application file for complete search history.

(56) References Cited

U.S. PATENT DOCUMENTS

| | | |
|---|---|---|
| 2004/0174619 A1 | 9/2004 | Beck et al. |
| 2004/0247826 A1 | 12/2004 | Conzone et al. |
| 2014/0021324 A1 | 1/2014 | Schumacher et al. |
| 2017/0357164 A1 | 12/2017 | Prochnau et al. |

FOREIGN PATENT DOCUMENTS

| | | |
|---|---|---|
| DE | 10 2011 079 072 A1 | 3/2012 |
| DE | 10 2011 087 389 A1 | 7/2012 |
| DE | 10 2012 212 503 A1 | 1/2014 |
| DE | 10 2015 201 249 A1 | 7/2016 |
| WO | WO 2012/013559 | 2/2012 |

OTHER PUBLICATIONS

International Search Report for corresponding PCT Appl No. PCT/EP2017/079074, dated Jan. 29, 2018.
Edwards, Mary J., "Current fabrication techniques for ULE™ and fused silica lightweight mirrors", Visual Communications and Image Processing; San Jose, vol. 3356, Aug. 1, 1998, pp. 702-711.
German Office Action, with translation thereof, for corresponding DE Appl No. 10 2017 200 635.8, dated Jul. 8, 2017.

\* cited by examiner

OPTICAL ARRANGEMENT, IN PARTICULAR LITHOGRAPHY SYSTEM

CROSS-REFERENCE TO RELATED APPLICATIONS

The present application is a continuation of, and claims benefit under 35 USC 120 to, international application PCT/EP2017/079074, filed Nov. 13, 2017, which claims benefit under 35 USC 119 of German Application No. 10 2017 200 635.8, filed Jan. 17, 2017. The entire disclosure of each of these applications is incorporated by reference herein.

FIELD

The disclosure relates to an optical arrangement, for example to a lithography system, in particular an EUV lithography system, including: a movable component, in particular a mirror; at least one actuator for moving the component; and at least one stop having a stop face for delimiting the movement of the component.

For the purposes of this application, a lithography system is understood as meaning an optical system or an optical arrangement that can be used in the field of lithography. Apart from a lithography apparatus, which serves for the production of semiconductor components, the optical system may be for example an inspection system for the inspection of a photomask used in a lithography apparatus (hereinafter also referred to as a reticle), for the inspection of a semiconductor substrate to be structured (hereinafter also referred to as a wafer) or a metrology system, which is used for measuring a lithography apparatus or parts thereof, for example for measuring a projection system. The optical arrangement or the lithography system may be in particular an EUV lithography system, which is designed for used radiation at wavelengths in the EUV wavelength range of between about 5 nm and about 30 nm.

BACKGROUND

DE 10 2012 212 503 A1 discloses a lithography apparatus which has a first component and a second component and also a coupling device in order to couple the first component and the second component to one another. The lithography apparatus has a sensing device, for sensing a movement of a base on which the lithography apparatus stands, and also an open-loop control device, which is designed to actuate the coupling device in dependence on the sensed movement of the base in order to limit a movement of the second component in relation to the first component. For this purpose, the coupling device may have at least one adjustable end stop. The adjustable end stop may be brought into abutting contact with a second component in the form of a mirror in order to produce a form-fitting fixing of the mirror with respect to a first component in the form of a force frame. It is intended by the fixing to avoid damage to the mirror in the event of a shock or in the event of tremors as a result of an earthquake.

DE 10 2011 087 389 A1 describes a positioning system with a stop for a component, for example for a mirror, wherein the stop delimits the path of movement of the component and is adjustably designed. The adjustability of the stop is intended to make an enlargement of the movement region of the mirror possible with simultaneous minimization of the gap width between the stop and the mirror. An open-loop and/or closed-loop control device may be provided with which the repositioning of the stop is controlled in open-loop and/or closed-loop fashion, wherein in particular an optimum region for the distance between a stop face of the actuator and the component is specified or the stop is repositioned such that the distance of the component from the stop face is kept within a predefined region. The optimum distance region can be between 5 micrometers and 15 micrometers.

SUMMARY

The disclosure seeks to provide an optical arrangement, for example a lithography apparatus, in which damage to movable components in the event of tremors is counteracted.

In a first aspect, an optical arrangement, in particular a lithography system, includes: a movable component, in particular a mirror; at least one actuator for moving the component; at least one stop having a stop face for delimiting the movement of the component. At least two stop faces for delimiting the movement of the movable component in one and the same movement direction are formed on a stop or on a plurality of stops. The stop faces are provided in particular for abutting against the same side of the movable component.

The optical arrangement may include at least one further actuator for moving the stop relative to the movable component, and at least one distance sensor for determining a distance between a stop face of the stop and the movable component.

As described in DE 10 2011 087 389 A1, which was cited in the introductory part, it is of advantage if the distance between the movable component and the stop, more precisely the stop face thereof, is kept within a predefined distance region with respect to the movable component. A gap between the movable component and the stop is advantageous for preventing vibrations from being transferred from the stop into the movable component, for example into a mirror. The inventors have recognized that the kinetic energy or the uncontrolled acceleration of the movable component can be minimized if the free trajectory of the movable component to the stop face of the stop is as short as possible.

In order to be able to set the distance between the movable component and the stop face in a reliable fashion even in the case of very small distances, the use of a distance sensor has proven advantageous. For the case that a gap in the optical arrangement can be dispensed with, the optical arrangement or the stop can also have a passive design. In this case, the distance sensor can be dispensed with and a contact can be realized for example by way of a spring element between the stop and the movable component.

The movable component is typically mounted so as to be movable relative to a carrying structure of the optical arrangement by way of the actuator, the carrying structure as a rule being a "force frame" of the optical arrangement, in particular of an (EUV) lithography apparatus. The force frame absorbs substantially all of the forces acting on the optical arrangement. The movable component can be, for example, an optical component part, for example an (EUV) mirror, a mechanical component part, for example a frame part, or an opto-mechanical component part. The frame part can in particular serve to receive an optical element or a group of optical elements for example in the form of mirrors that form a sub-lens. Similar to in the case of optical elements in the form of (EUV) mirrors, the frame part can be decoupled from the carrying structure for example by spring elements such that it is movable in relation to the carrying structure.

In one embodiment, the distance sensor is configured for contactlessly determining the distance between the stop face of the stop and the movable component. It is possible using a distance sensor that is configured for contactlessly determining the distance to avoid mechanical stresses being transferred by the distance sensor onto the movable component. The distance sensor can be configured for example as an optical distance sensor, for example using a laser as a measurement beam, or possibly as a capacitive distance sensor.

In one embodiment, the optical arrangement includes a closed-loop control device for controlling the movement of the stop, more specifically the stop face, to a distance of less than 5 millimeters, preferably of less than 2 millimeters, with respect to the movable component. As was described further above, it is advantageous if the stop during operation of the optical arrangement, but possibly also during the transport of the optical arrangement, has the lowest possible distance from the movable component, which can be achieved by way of closed-loop control based on the distance signal of the distance sensor. The closed-loop control device can possibly also take the frequency, size and/or direction of the movement of the movable component, more specifically of the actuator moving it, into account when controlling the distance, for example as is described in DE 10 2011 087 389 A1, which was cited in the introductory part and is incorporated into the content of this application in respect of this aspect by reference.

In a further embodiment, the optical arrangement includes at least one damping device for damping a movement of the stop face along a movement direction of the movable component. The damping device serves to brake an undesired movement of the movable component, wherein the component strikes the stop face of the stop and pushes against the (movable) stop in the movement direction. Due to the free path between the movable component and the stop being short, the kinetic energy generated during the undesired movement of the movable component is low. This low kinetic energy that is generated over the small trajectories can be absorbed by the damping device.

The damping device can be configured in various ways, for example, the damping device can include a spring element or a fluid damper to damp the movement of the stop. The use of a damping element for example in the form of a spring element is typically advantageous for damping the movement of the stop if a further actuator, which is configured as a mechanical actuator, is used. When using actuators in which a fluid, that is to say a liquid or gas, is used for the movement of the stop, a damping device in the form of a fluid damper is advantageous, although a mechanical damper can likewise be used.

For example, a fixedly set throttle bore can be used as the fluid damper, the throttle bore forming a flow opening for the fluid that separates a high pressure side from a low pressure side when a fluid in the form of a liquid, such as oil, is used. If the fluid is a gas, the damping effect of the fluid damper can also consist of a throttle volume being made available in which the gas is compressed such that it absorbs the kinetic energy of the movable component.

In a further embodiment, the further actuator is a hydraulic actuator or a pneumatic actuator. In this case, the further actuator can have for example a hydraulic cylinder or pneumatic cylinder, the piston rod of which forms the stop on which the stop face is formed. The further actuator can be configured for example as a hydraulic pump or as a pneumatic pump which effects the movement of the piston rod in the hydraulic or pneumatic cylinder. As was described further above, the damping device in this case is preferably configured as a fluid damper, for example in the form of a throttle (bore) or a throttle volume.

In a further embodiment, the stop has at least one membrane, on one side of which the stop face is formed and on the other side of which a space adjoins, which is sealed off with respect to the environment and into which a fluid is able to be admitted, for changing the curvature of the membrane. In this example, the stop is formed by a membrane and the space adjoining the membrane into which a fluid is fed or discharged by way of a feed and/or discharge line to change the curvature of the membrane or to stretch the membrane, as a result of which the distance between the movable component and the membrane and consequently the stop face can be set.

In a further, alternative embodiment, the stop has a lever arm that is pivotable about an axis of rotation. The axis of rotation, formed for example by a hinge or an articulation, can be formed at an end of the lever arm, although it is likewise possible for the axis of rotation to be formed at a different location along the lever arm for appropriately transmitting the power transmission of a rotary drive to the lever arm. The stop face of the stop can in this case be formed directly on the lever arm, but it is also possible for the stop face to be coupled to the lever arm by way of a damping element, for example by way of a spring element.

A further aspect of the disclosure relates to an optical arrangement which can be configured in particular as described further above and in which at least two stop faces that are provided to delimit the movement of the movable component in the same movement direction, in particular for abutment on the same side of the movable component, are formed on one and the same stop or on a plurality of stops.

When braking the movable component by way of (end) stops, the problem exists that, in particular in the case of movable components having a large mass, high local forces occur when the movable component is braked abruptly. In order to avoid this problem, it is proposed to use a plurality or a multiplicity of stop faces to distribute the force that is used to restrict the movement of the movable component over a plurality of contact points and thus over a larger area, as a result of which the force acting on a respective stop face is reduced.

In a simple case, this creates a clear overdetermination during braking of the movable component by the (end) stops, for example by using two or more stops that are aligned parallel with respect to one another to brake the movement of the movable component along the same movement direction. The same movement direction within the meaning of this application is understood to mean not only the axial direction (for example X-direction, Y-direction, . . . ), but also the orientation of the axis direction (for example positive or negative X-direction). The two or more stops can be movable, in particular displaceable, only along the same movement direction. However, it is also possible that two or more of the stops or stop faces thereof are aligned at an angle to the movement direction along which the movement of the movable component is delimited. In this case, the stops can additionally at least partially also serve for delimiting the movement path in a further movement direction.

Alternatively, it is possible for only one stop to be used for delimiting the movement of the movable component along a movement direction, the stop, however, having a plurality of stop faces. In this case, too, the force acts over a larger area during braking of the movement of the movable component, which reduces the force acting on a respective stop face. A stop having two or more stop faces can in particular be connected to the carrying structure by way of one and the same damping device. It is to be understood that the two possibilities described here can also be combined, that is to say that a plurality of stops, at least one of which having two or more stop faces, can be used to delimit the movement of the movable component in one and the same movement direction.

In a further embodiment, at least five stop faces and no more than ten stop faces are provided for delimiting the movement of the movable component in at least one direction. As was described further above, the action of force can be distributed well by increasing the number of stop faces or contact points. The minimum number of the stop faces depends on the permissible surface tension or contact tension of the movable component, for example a mirror. The installation space available in optical arrangements for example in the form of EUV lithography apparatuses is low, meaning that the space used for the stops and thus the selected number of stop faces should not be too large.

In a further embodiment, the movable component has at least one cutout for receiving a head region of at least one stop on which at least two stop faces for delimiting the movement of the movable component in at least two different, in particular mutually perpendicular movement directions are formed. In this embodiment, a respective stop engages by way of its head region in a cutout or recess of the movable component. In this way, the movement of the component in two, possibly in three, mutually perpendicular movement directions can be limited. It is likewise possible by way of stop faces which are formed on mutually opposite sides of the head region of the stop to delimit the movement in two mutually opposing movement directions, that is to say both in the positive and negative X-direction, for example. It is to be understood that the stop, more specifically the head region thereof, can also have, for example, a substantially cylindrical geometry with a substantially cylindrically peripheral stop face. The movement path of the component both along an axial movement direction and perpendicularly thereto, that is to say along a movement direction that extends radially with respect to the cylindrical head region, can be delimited in this case, too. Alternatively, the head region can also have a, for example, spherical or ellipsoidal geometry. The geometry of the cutout can be adapted to the geometry of the head region, but it is also possible for example for a spherical head region to be arranged in a rectangular or a cuboid cutout.

In a further configuration, the stop or the stops has/have a damping device for damping the movement of the stop faces along the movement direction that is delimited by the stop or by the stops. As was described further above, the damping device can be a device configured for mechanically damping, for example a spring element, a fluid damper, etc.

A further aspect of the disclosure relates to an optical arrangement of the type mentioned in the introductory part, which can be configured in particular as described further above and in which the movable component is a mirror, wherein the mirror has a substrate with a first substrate part on which a reflective surface is formed and a second substrate part, wherein the second substrate part is made from a material that has a greater ratio of modulus of elasticity to density and/or a greater breaking length than the first substrate part and/or wherein cutouts are formed in the second substrate part.

In this aspect, it is proposed to reduce the forces acting on a stop face in the event of an impact of the movable component by virtue of reducing the mass or the weight of the movable component, that is to say it is proposed, unlike in the case of the solutions described further above, to modify not the stop but the movable component in the form of the mirror in a manner such that the weight thereof is reduced, without simultaneously reducing the stiffness thereof, if possible. By reducing the weight of the mirror, the kinetic energy of the mirror in the case of an impact on the stop face is also reduced proportionally.

The first mirror part on which the reflective surface is formed consists of a material or substance that meets the desired properties with respect to the optical and thermal properties of a mirror substrate. This material in a mirror for EUV lithography is typically what is known as a zero-expansion material, that is to say a material having a low coefficient of thermal expansion which typically has a zero crossing at what is known as a zero crossing temperature. The substrate can be, for example, quartz glass doped with titanium dioxide (ULE®) or a glass ceramic, such as Zerodur®.

The second substrate part can be made from a material having a greater ratio of modulus of elasticity to density and/or a greater breaking length than the material of the first substrate part. The first substrate part and the second substrate part can be different materials or substances, that is to say the mirror is configured to be at least two pieces. The two substrate parts can in this case be connected to one another at a boundary face, for example by a direct connection (bonding, (glass) welding, . . . ) or a cohesive connection (adhesive bonding, (glass) soldering, . . . ).

In order to attain high natural frequencies of the mirror, the (axial) stiffness of the second substrate part can be increased by increasing the modulus of elasticity and/or the mass or the density of the substrate material can be reduced. If the ratio of modulus of elasticity to density increases, it is possible to reduce the mass while maintaining the stiffness. In order to attain high natural frequencies of the mirror, it can alternatively or additionally be advantageous if the second material has a greater breaking length than the material of the first substrate part. The breaking length $L_R$ is defined as the quotient of the strength $R_M$, measured in tensile testing, and the density p, i.e. where $L_R = R_M/\rho$.

Suitable materials for the second substrate part that have a greater ratio of modulus of elasticity to density than the first substrate part are for example technical ceramic materials (in particular non-oxide ceramics) silicon carbide (SiC), and diamond. In the case of the material for the second substrate part, which has a greater breaking length than the material of the first substrate part, the materials mentioned further above can likewise be used. For fixing the two substrate parts to one another, it is advantageous if they are made from materials having similar material properties. In particular, a direct connection of two substrate parts to one another, both having silicon as a constituent part, has proven advantageous because the silicon bonds formed between two such substrate parts are relatively strong.

Reducing the mass of the second substrate part can alternatively or additionally be attained by way of a suitable shape or geometry, utilizing the fact that, at a sufficient distance from the reflective surface, the substrate material no longer needs to be present continuously. In this case, cutouts are formed in the second substrate part. The cutouts are typically configured in the form of blind holes or holes that extend from the bottom side, that is to say from the side facing away from the reflective surface, into the substrate.

The blind holes can be selected in terms of diameter and the spacing between them such that they reduce the weight of the mirror without excessively reducing the stiffness thereof, because the intermediate spaces that are formed between the cutouts or blind holes and in which the material of the substrate is present form stiffening ribs. The mirror can in this case be configured in particular in one piece. In this case, the two substrate parts differ in that cutouts are provided in the second substrate part while the first substrate part, which adjoins the reflective surface or includes the reflective surface, is formed completely from the substrate material and is free from cutouts.

The second substrate part can give the mirror the desired stiffness, while the first substrate part gives the mirror its optical properties. The number, the arrangement, and the geometry of the cutouts or blind holes can be optimized for example using topological design methods in accordance with determined specified parameters such as the deformation or stress in the substrate material. One possibility for producing mirror blanks made of glass ceramic for producing a lightweight structure is described for example in US 2004/0247826 A1, which is incorporated in the subject matter of this application by reference.

Further features and advantages of the disclosure are evident from the following description of exemplary embodiments of the disclosure, with reference to the figures of the drawing, which show aspects of the disclosure, and from the claims. The individual features may be realized in each case individually by themselves or as a plurality in any desired combination in a variant of the disclosure.

BRIEF DESCRIPTION OF THE DRAWINGS

Exemplary embodiments are illustrated in the schematic drawing and will be explained in the following description, in which.

DESCRIPTION OF EXEMPLARY EMBODIMENTS

In the following description of the drawings, identical reference signs are used for identical or functionally identical components.

Figure 1:
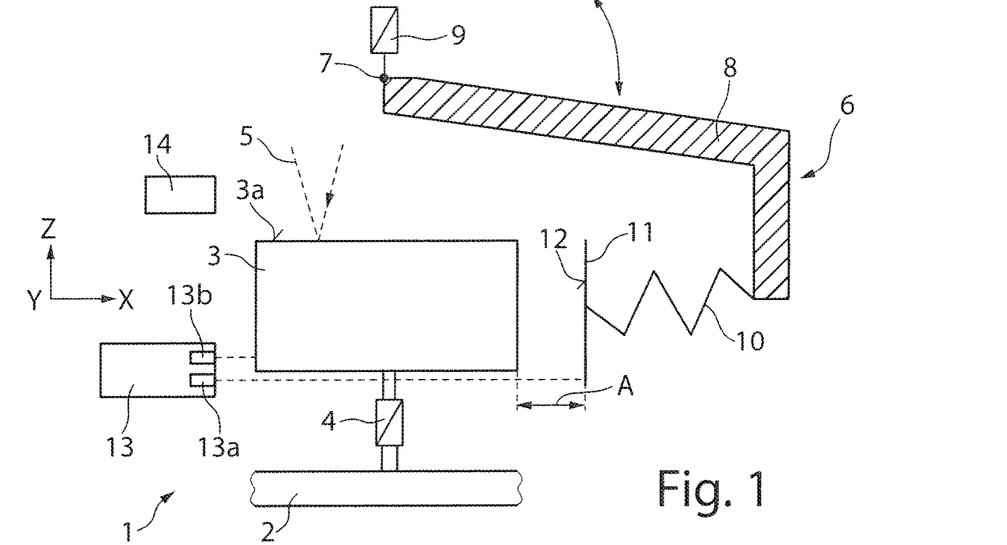
FIG. 1 shows a schematic illustration of a detail of an EUV lithography apparatus having a movable component in the form of an EUV mirror and having an (end) stop having a lever arm that is pivotable about an axis of rotation and having a distance sensor.

FIG. 1 schematically shows a detail of an optical arrangement 1 in the form of a lithography apparatus, to be more precise in the form of an EUV lithography apparatus. The EUV lithography apparatus 1 has a carrying structure 2 in the form of a force frame that absorbs all essential forces during the operation of the EUV lithography apparatus 1 and transmits them to the ground by way of a foundation, which is not shown, of the EUV lithography apparatus 1. The EUV lithography apparatus 1 has a plurality of movable components 3 in the form of EUV mirrors, of which one is illustrated by way of example in FIG. 1.

The movable EUV mirror 3 can be moved relative to the carrying structure 2 with the aid of an actuator 4. The actuator 4 serves to move the EUV mirror 3 freely in space so as to reflect EUV radiation 5 that is incident on the front side 3a of the EUV mirror 3 into a suitable direction at a reflective coating that is present there. The actuator 4 can be configured, for example, as a contactless, in particular magnetic actuator and produce a magnetic field within which the EUV mirror 3 levitates during the operation of the EUV lithography apparatus 1. The EUV mirror 3 is here generally supported softly, that is to say movably, on the carrying structure 2 by way of springs, which have not been shown.

During operation of the EUV lithography apparatus 1, the EUV radiation 5, which is produced by an EUV light source that has not been shown in further detail, is supplied, via an illumination system, to a projection system that serves for imaging a structure on a mask onto a light-sensitive substrate, the illustration of which has been dispensed with in FIG. 1 in each case for the purpose of simplifying the illustration.

FIG. 1 likewise shows by way of example a stop 6 having a lever arm 8 that is rotatable about an axis of rotation 7 or about a hinge. The lever arm in the example shown is pivotable about the axis of rotation 7 using a further (mechanical) actuator 9 in the form of a rotary drive, as is indicated by a double-headed arrow. Rather than using a further mechanical actuator 9, a contactless actuator, for example in the form of a magnetic actuator, may likewise be used for rotating the lever arm 8. It is to be understood that the further actuator 9 does not necessarily have to engage at the axis of rotation 7, but can possibly also act on the lever arm 8 at a different location to deflect it.

A stop element 11 having a stop face 12 is connected to the lever arm 8 via a damping device in the form of a spring element 10. A guide, for example in the form of a sliding block guide, which is not illustrated in more detail, ensures that the stop element 11 and consequently also the planar stop face 12 is displaced always in parallel fashion when the lever arm 8 is pivoted about its axis of rotation 7, and remains aligned perpendicularly to the X-direction of an XYZ coordinate system shown in FIG. 1, the Z-axis of which corresponds to the direction of gravity. By pivoting the lever arm 8 about the axis of rotation 7, the distance A between the EUV mirror 3 and the stop face 12 of the stop element 11 can thus be varied.

The EUV lithography apparatus 1 has a distance sensor 13, which serves to precisely measure the distance A between the EUV mirror 3, more specifically a planar side of the EUV mirror 3 likewise extending in the Y-direction, and the stop face 12. For this purpose, the distance sensor 13 has two measurement light sources 13a,b that direct a first measurement light beam and a second measurement light beam, for example a laser beam, onto a further planar side face of the mirror 3 or onto the stop face 12 of the stop 6. It is possible in a manner known to a person skilled in the art to determine the distance A between the side face, facing the stop face 12, of the EUV mirror 3 and the stop face 12 on the basis of the two reflected measurement light beams. The distance sensor 13 operates optically, that is to say contactlessly, which means that no forces are exerted on the EUV mirror 3 during the determination of the distance A.

The EUV lithography apparatus 1 has a closed-loop control device 14, which actuates or controls the further actuator 9, on the basis of the distance A determined by the distance sensor 13, to move the stop 6, more specifically to move the stop face 12, such that the distance A is always at less than 5 micrometers, possibly at less than 2 micrometers during the operation of the EUV lithography apparatus 1. A distance A between the stop 6 and the EUV mirror 3 that is as small as possible has proven advantageous to minimize the free trajectory of the EUV mirror 3 up to the stop face 12, which means that the kinetic energy which the EUV mirror 3 absorbs along the free trajectory is as low as possible. In this way, uncontrolled acceleration of the EUV mirror 3 due to tremors, for example in the event of an earthquake or during transport of the EUV lithography apparatus 1, can be almost entirely avoided, such that, when the EUV mirror 3 impacts the stop face 12, the EUV mirror 3 or the stop 6 is not damaged.

The remaining, comparatively low kinetic energy of the EUV mirror 3 which is absorbed by it when moving along the trajectory thereof along the distance A is absorbed by the spring element 10 of the stop 6 and converted into potential energy of elastic deformation of the spring element 10. During the closed-loop control of the distance A, it is possible, where applicable, for an imminent movement of the EUV mirror 3 that is known to the closed-loop control device 14 to be taken into account.

Figure 2:
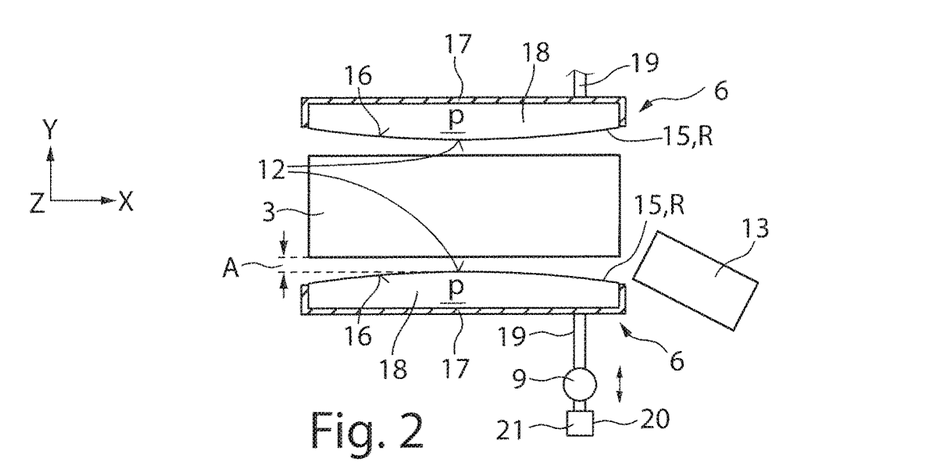
FIG. 2 shows a schematic illustration analogous to FIG. 1 having an (end) stop in the form of a membrane and a gas-filled space adjoining the membrane for changing the curvature of the membrane.

FIG. 2 likewise shows a movable component in the form of an EUV mirror 3, wherein the illustration of the actuator 4 for moving the EUV mirror 3 and the illustration of the carrying structure 2 have been dispensed with for simplification purposes. In the example shown in FIG. 2, in each case a stop 6 for delimiting the movement of the EUV mirror 3 in the positive Y-direction (+Y) and for delimiting the movement of the EUV mirror 3 in the negative Y-direction (−Y) in the EUV lithography apparatus 1 is provided.

The stops 6 each have an elastic membrane 15, the side of which that faces the EUV mirror 3 forms the stop face 12. The elastic membrane 15 is attached at the peripheral rim thereof to a housing 17. A side 16, facing away from the EUV mirror 3, of the membrane 15 adjoins a space 18 that is formed in the housing 17, is sealed off with respect to the environment, and is connected via a feed and discharge line 19 to a gas reservoir 20 that is filled with compressed air 21. The compressed air 21 can be taken from the gas reservoir by a further actuator 9 in the form of a pneumatic pump and can be fed to the space 18 formed in the housing 17, with the result that the compressed air 21 is admitted into the space, which then forms a gas-filled space 18.

The amount of compressed air 21 present in the space that is formed in the housing 17 and thus the pressure p in the gas-filled space 18 can be set by the actuator 9 in the form of the pneumatic pump. When changing the pressure p in the gas-filled space 18, the curvature R or the radius of curvature of the membrane 15 and hence the distance A between the curved stop face 12 of the membrane 15 of the stop 6 and the EUV mirror 3 is changed. The gas-filled space 18 serves as a fluid damper for damping the movement of the stop 6, more specifically of the membrane 15, on which the stop face 12 is formed. It is possible in this way to damp the relatively low kinetic energy of the EUV mirror 3 that is absorbed along the relatively short free trajectory of the EUV mirror 3 along the gap between the EUV mirror 3 and the membrane 15.

An optical distance sensor 13 that measures the distance A between the membrane 15 or the stop face 12 and the EUV mirror 3 with an accuracy in the micrometer range likewise serves for the closed-loop control of the distance A with the aid of the closed-loop control device 14, which is not illustrated in the depiction in FIG. 2. It is to be understood that, unlike the illustration in FIG. 2, a gas other than compressed air 21 or a liquid, in particular water, that is fed into the space 18 may be used where applicable. In the latter case, rather than a further actuator 9 in the form of a pneumatic pump, a hydraulic pump is used.

Figure 3:
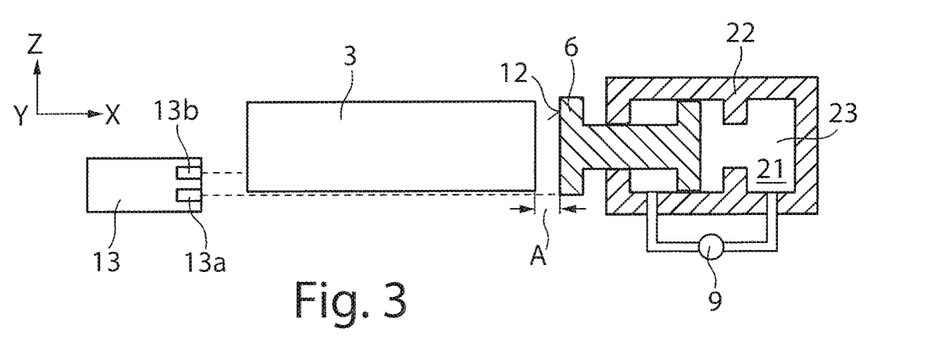
FIG. 3 shows a schematic illustration of an (end) stop in the form of a piston rod that is mounted displaceably in a hydraulic cylinder.

FIG. 3 shows an EUV mirror 3 as the movable component and a stop 6 in the form of a piston rod having a planar stop face 12, which serves, as in the example shown in FIG. 1, for abutment on a planar side face of the EUV mirror 3 if the EUV mirror 3 is moved along a movement direction, corresponding to the (positive) X-direction, on account of sudden tremors. As in FIG. 1, the distance sensor 13 even in the example shown in FIG. 3 has two measurement light sources 13a,b to determine the distance A between the stop face 12 and the EUV mirror 3.

The stop 6 in the form of the piston rod is guided displaceably in a pneumatic cylinder 22 and can be displaced in the (positive and negative) X direction using a (further) actuator 9 in the form of a pneumatic pump by virtue of compressed air 21 being fed into or discharged from the pneumatic cylinder 22 in a known manner by two feed and/or discharge lines formed at opposite ends. In the example shown in FIG. 3, a throttle space 23 is formed in the pneumatic cylinder 22 to damp the movement of the stop 6 in the form of the piston rod, the throttle space serving as a fluid damper since the compressed air that is located there is being compressed. Rather than using a throttle that is fluidically coupled to the stop 6, it is also possible to use a (fixed) throttle that is coupled mechanically to the stop 6, for example in the form of a spring element 10, to damp the movement of the stop face 12. The damping of the movement of the stop 6 can also be effected passively (in the manner of a shock absorber), that is to say a pump is not absolutely necessary for this purpose.

Figure 4:
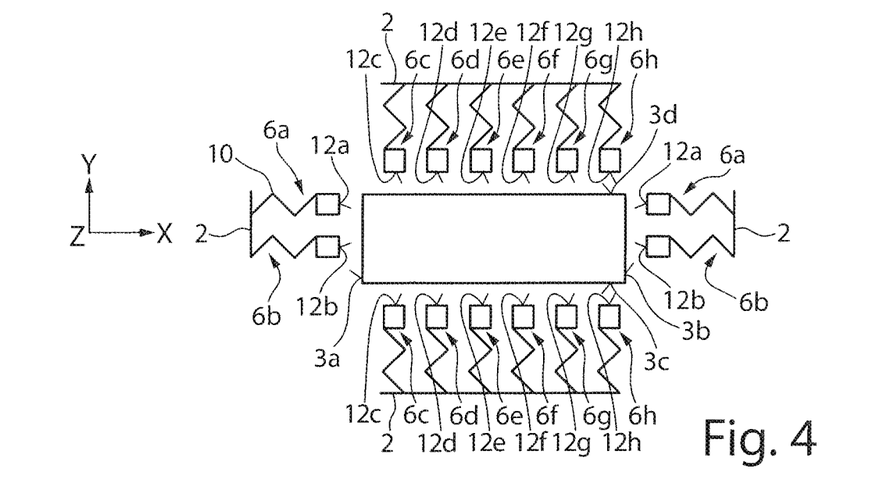
FIG. 4 shows a schematic illustration of a movable component in the form of a frame component part and having two or six (end) stops each having a stop face for delimiting the movement of the frame component part along the same movement direction.

FIG. 4 shows a further possibility for reducing the local forces that arise when braking a solid movable component in the form of a frame component part 3, with the result that damage to the frame component part 3 or to other components does not occur. For example, one or more EUV mirrors, which are not illustrated in FIG. 4, can be mounted on the frame component part 3.

In the example shown in FIG. 4, in each case two stops 6a,b having one stop face 12a,b each, are arranged on the two mutually opposite narrow sides 3a,b of the frame component part 3. The two stops 6,b are in each case connected to the carrying structure 2 of the EUV lithography apparatus 1 via a spring element 10. The stop face 12a,b of the two stops 6a,b is made to abut the respective narrow side 3a,b of the frame component part 3 when the frame component part 3 is unintentionally accelerated in the positive X-direction or in the negative X-direction in the event of tremors with a force such that the frame component part reaches the stop faces 12a,b. By providing two stop faces 12a,b having parallel alignment with respect to one another on two stops 6a,b acting on the same side 3a,b of the frame component part 3, the force that is exerted on the respective stop face 12 is halved because it is distributed over the two stop faces 12a,b or over the contact points formed there.

Accordingly, six stops 6c-h that likewise have a stop face 12c-h each, which have or form contact points for the frame component part 3, are arranged on the two long sides 3c,d of the frame component part 3. On account of the six stops 6c-h, the force upon impact of a respective long side 3c,d of the frame component part 3 can be reduced to a sixth.

Figure 5:
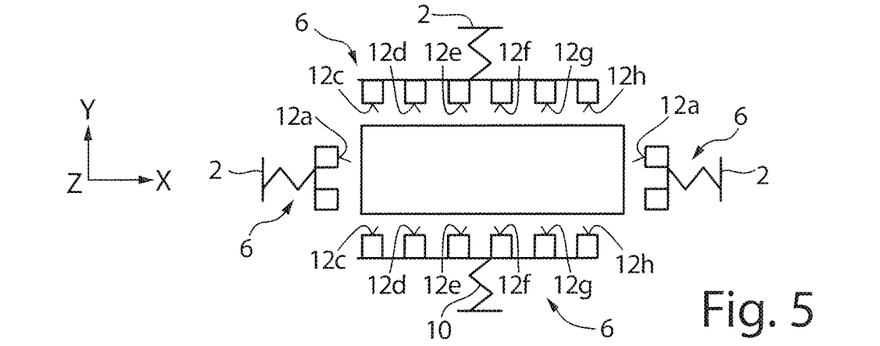
FIG. 5 shows a schematic illustration analogous to FIG. 4 having (end) stops each having two or six stop faces for delimiting the movement of the frame component part.

FIG. 5 shows a frame component part 3 in which, as in the example shown in FIG. 4, in each case two stop faces 12a,b are arranged for abutment on a respective front side 3a,b of the frame component part 3 and in addition six stop faces 12c-h are arranged for abutment on a respective long side 3c,d of the frame component part 3. In contrast to the example shown in FIG. 4, the two stop faces 12a,b and the six stop faces 12c-h in FIG. 5 are in each case formed on only one stop 6 that is connected to the carrying structure 2 via a single spring element 10. In the example shown in FIG. 5, the force that is exerted along a respective movement direction −X, +X, −Y, +Y onto a respective stop 6 can be reduced analogously to the example shown in FIG. 4 by way of the force being distributed over a plurality of stop faces 12a,b and 12c-h.

The minimum number of stops 6a,b and 6c-h or of stop faces 12a,b 12e-f, which are arranged on a respective side 3a-d of the frame component part 3 or alternatively on a respective side of an EUV mirror 3, is a function of the permissible surface tension or contact tension of the frame component part 3 or of the EUV mirror 3. It has proven advantageous if a number of at least five and generally no more than ten stop faces 12c-h are arranged along at least one side 3a-d of a movable component 3, for example in the form of a frame component part 3 because the installation space in the EUV lithography apparatus 1 is limited.

Figure 6:
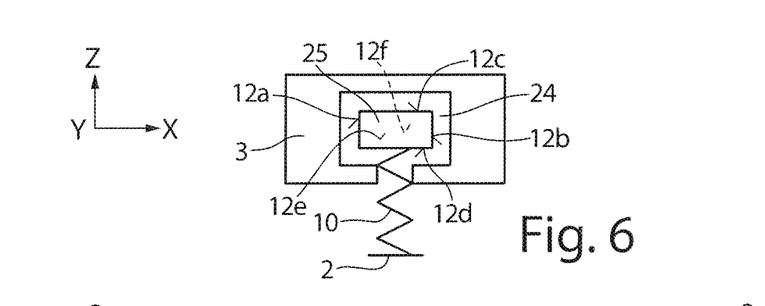
FIG. 6 shows a schematic illustration of a frame component part and of an (end) stop, the head region of which is received in a cutout of the frame component part, wherein six stop faces are formed on the head region for delimiting the movement of the frame component part in six different movement directions.

In order to reduce the space used by the arrangements of the stops 6a-h or 6 shown in FIG. 4 and FIG. 5, a respective stop 6a-h, 6 can have a more compact design as long as a movable component for example in the form of the frame component part 3 has a cutout 24, as is illustrated in FIG. 6. A head region 25 of the stop 6 is arranged in the cutout 24 or in the recess in the example shown in FIG. 6. The head region 25 in the example shown has six stop faces 12a-e and in each case serves for abutment of the frame component part 3 in one of the six movement directions −X, +X, −Y, +Y, −Z, +Z, that is to say the head region 25 delimits the movement of the frame component part 3 both in the horizontal direction (X, Y) and in the vertical direction (Z).

If a respective stop 6a-h, 6 is formed in the manner illustrated in FIG. 6, the number of stops 6 that are used to delimit the movement of the frame component part 3 can be reduced. For example, in the example shown in FIG. 4, it may be possible to completely dispense with the two stops 6a,b that act on the respective front sides 3a,b. However, it is to be understood that it is not absolutely necessary for the stops 6 to be formed in the manner shown in FIG. 6. It is furthermore to be understood that the head region 25 of the stop 6 does not necessarily have to have a substantially cuboid geometry. The head region 25 can have, for example, a curved surface and have for example the geometry of a sphere, an ellipsoid, etc.

In addition to the possibilities, described further above, for reducing the force F acting on the movable components 3 or on a respective stop by reducing the acceleration a or by increasing the area on which the force F that is generated during the acceleration acts, the force F can also be reduced, in accordance with Newton's equation F=m×a, by the accelerated mass m of the movable component 3 being reduced, as will be described below.

Figure 7A:
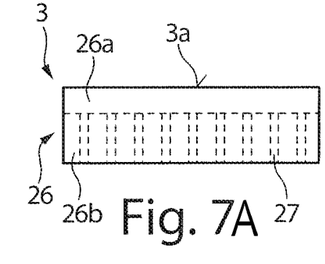
FIGS. 7A, 7B show schematic illustrations of a side view and of a view from the lower side of an EUV mirror having a first, continuous substrate part, on which a reflective surface is formed, and having a second substrate part, in which blind holes are formed.
Figures 7B, 8:
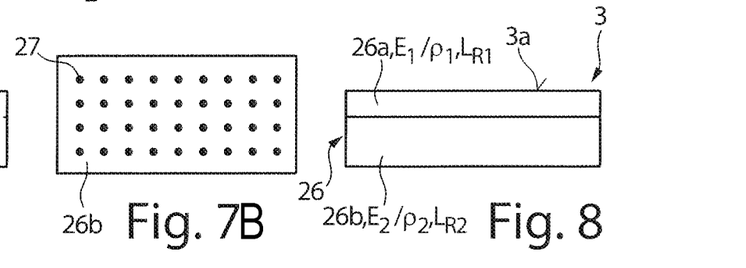
FIG. 8 shows a schematic illustration of an EUV mirror analogous to FIG. 7A having a first substrate part and a second substrate part made from different materials.

FIGS. 7A,7B show a movable component in the form of a mirror 3 having a substrate 26, which in the example shown has a first substrate part 26a, in which substrate material is continuously present, and a second substrate part 26b, into which cutouts in the form of blind holes 27 are introduced to reduce the weight of the mirror 3. In the example shown, the blind holes 27 are arranged in a regular matrix arrangement, as is apparent in particular from FIG. 7B, which shows a plan view of the lower side of the second substrate part 26. The intermediate spaces between the blind holes 27 in which the material of the substrate 3 is present form stiffening ribs, which means that the mirror 3 is weakened by the blind holes 27 to only a negligible degree. A suitable arrangement, geometry, and size of the blind holes 27 can be optimized by way of suitable topological design methods in accordance with the determined parameters such as deformation or stress.

The reflective surface 3a of the mirror 3 is formed on the first substrate part 26a, more specifically a reflective coating forming the reflective surface 3a is applied to the surface of the substrate 26. The first substrate part 26a has, starting from the reflective surface 3a, a thickness that is sufficiently large to ensure that the optical properties of the mirror 3 are not negatively affected by the blind holes 27 that are introduced into the second substrate part 26b. On account of the blind holes 27, the second substrate part 26b has a lower density than the first substrate part 26a. The intermediate spaces formed between the blind holes 27 form stiffening ribs, with the result that the mass of the second substrate part 26b can be reduced without the stiffness of the second substrate part 26b being reduced too much here.

In the example shown in FIGS. 7A,7B, the substrate 26 is formed in one piece, that is to say the first and second substrate parts 26a,b consist of the same material. For the case that the mirror 3 is used for UV lithography at wavelengths of less than approximately 250 nm, the material of the substrate 26 can be, for example, quartz glass. For the case that the mirror 3 is to be used for EUV lithography at wavelengths of between approximately 5 nm and approximately 30 nm, as is the case with the EUV mirror 3 which was shown further above in connection with FIG. 1, the substrate 26 is typically what is known as a zero-expansion material, which has a very small coefficient of thermal expansion over a relatively large temperature range, for example quartz glass doped with titanium dioxide, which is known as ULE®, or a glass ceramic, for example Zerodur®.

FIG. 8 shows an example of a mirror 3 in which the first substrate part 26a, on which the reflective surface 3a is formed, is made from a first material, while the second substrate part 26b is made from a second material that differs from the first one. The two substrate parts 26a,b are monolithically joined together at their boundary faces, for example by way of a direct connection, for example bonding or glass welding, or can be cohesively connected to one another possibly using a joining mechanism, for example an adhesive or glass solder.

The first substrate part 26a is typically made from one of the materials described further above and has a first modulus of elasticity $E_1$, a first density $\rho_1$, and a first breaking length $L_{R1}$, while the second substrate part 26b is made from a material that has a second modulus of elasticity $E_2$, a second density $\rho_2$, and a second breaking length $L_{R2}$. To reduce the weight of the mirror 3 while maintaining its stiffness, it is advantageous if the ratio of modulus of elasticity $E_2$ to density $\rho_2$ of the material of the second substrate part 26b is greater than the ratio of the modulus of elasticity $E_1$ to the density $\rho_1$ of the material of the first substrate part 26a. In addition or alternatively, it is advantageous if the material of the second substrate part 26b has a breaking length $L_{R2}$ that is greater than the breaking length $L_{R1}$ of the material of the first substrate part 26a. Both the ratio of modulus of elasticity E to density $\rho$ and the breaking length $L_R$ represent material properties that are relevant for determining which natural frequencies the mirror 3 has. If the second substrate part 26b has a greater ratio of modulus of elasticity $E_2$ to density $\rho_2$ or a greater breaking length $L_{R2}$ than the first substrate part 26a, it is typically advantageous if the stop 6, or stops 6, engage(s) at the second substrate part 26b or is/are made to abut on the second substrate part 26b.

The breaking length $L_R$ is defined as the quotient of the strength $R_M$, measured in tensile testing, and the density $\rho$, i.e. where $L_R=R_M/\rho$. The material of the second substrate part 26b can be, for example, a technical ceramic material, ideally a non-oxide ceramic. In the example shown, the material of the second substrate part 26b is silicon carbide (SiC), which has a high breaking length $L_{R2}$ of approximately 110 km. (Synthetic) diamond also has a high breaking length $L_R$ or a large ratio of modulus of elasticity E to density $\rho$ and is thus suitable as a material for the second substrate part 26b.

If the second substrate part 26b has a greater breaking length $L_R$ than the first substrate part 26a, the second substrate part 26b contributes to a stiffening of the substrate 26, because the dimensional stability of the substrate 26 and thus of the mirror 3 is increased by the second substrate part 26b. If appropriate, cutouts 27 can be formed in the second substrate part 26b, which has a greater ratio of modulus of elasticity $E_2$ to density $\rho_2$ and/or a greater breaking length $L_{R2}$ than the first substrate part 26a, as shown in FIGS. 7A,7B. The mirror 3, shown in FIGS. 7A,7B and in FIG. 8, can form the movable component 3, for example in the examples shown in FIG. 1 to FIG. 6.

It is to be understood that two or all three of the possibilities described further above (reducing the free trajectory, reducing the force, reducing the mass) for avoiding damage to movable components 3 in an optical arrangement, for example in a lithography apparatus, can be combined. It is likewise possible for the movable component to be an optical element that is not designed to reflect but to transmit radiation, for example a lens element as is used in a lithography apparatus for UV lithography. Of course, it is also possible to protect in the manner described further above, instead of frame parts, other, non-optical components from damage.

What is claimed is:

1. An optical arrangement, comprising:
    a movable component having a side;
    a first actuator configured to move the movable component; and
    a first stop comprising a first stop face configured to delimit movement of the movable component in a movement direction,
wherein:
    the optical arrangement further comprises a second stop face which is different from the first stop face;
    the second stop face is configured to delimit the movement of the movable component in the movement direction;
    the first and second stop faces abut against the side of the movable component; and
    one of the following holds:
        i) the first stop comprises the second stop face; and the first stop comprises a damping device configured to damp movement of the first and second stop faces along the movement direction; or
        ii) the optical arrangement further comprises a second stop;
            the second stop comprises the second stop face;
            the first stop comprises a first damping device configured to damp movement of the first stop face along the movement direction; and
            the second stop comprises a second damping device configured to damp movement of the second stop face along the movement direction.

2. The optical arrangement of claim 1, wherein the first stop comprises a damping device configured to damp movement of the first and second stop faces along the movement direction.

3. The optical arrangement of claim 1, wherein:
    the optical arrangement further comprises a second stop which comprises the second stop face;
    the first stop comprises a damping device configured to damp movement of the first stop face along the movement direction; and
    the second stop comprises a damping device configured to damp movement of the second stop face along the movement direction.

4. The optical arrangement of claim 1, wherein the movable component comprises a movable mirror.

5. The optical arrangement of claim 1, wherein the first stop comprises the second stop face.

6. The optical arrangement of claim 1, wherein the optical arrangement further comprises a second stop which comprises the second stop face.

7. The optical arrangement of claim 1, wherein:
    the optical arrangement further comprises third, fourth and fifth stop faces;
    for each of the first through fifth stop faces, the stop face is different from any other of the first through fifth stop faces; and
    each of the third, fourth and fifth stop faces is configured to delimit movement of the movable component in the movement direction.

8. The optical arrangement of claim 7, wherein the optical arrangement comprises at most 10 stop faces configured to delimit movement of the movable component in the movement direction.

9. The optical arrangement of claim 1, wherein the movable component comprises a cutout configured to receive a head region of the first stop, the first top comprises at least two stop faces configured to delimit movement of the movable component in the first direction and in a second direction which is different from the first direction.

10. The optical arrangement of claim 1, further comprising a damping device configured to damp movement of the first stop face along the movement direction.

11. The optical arrangement of claim 10, wherein the damping device comprises a member selected from the group consisting of a spring element and a fluid damper.

12. The optical arrangement of claim 1, wherein the first stop comprises a lever arm that is pivotable about an axis of rotation.

13. An apparatus, comprising:
the optical arrangement according to claim 1,
wherein the apparatus is a lithography apparatus.

14. The apparatus of claim 13, wherein the lithography apparatus is an EUV lithography apparatus.

15. An optical arrangement, comprising:
a movable mirror having a side;
a first actuator configured to move the movable mirror; and
a first stop comprising a first stop face configured to delimit movement of the movable mirror in a movement direction,
wherein:
the movable mirror comprises a substrate which comprises first and second substrate parts;
the movable mirror comprises a reflective surface supported by the first substrate part; and
at least one of the following holds:
the second substrate part comprises a material having a greater ratio of modulus of elasticity to density than the first substrate part;
the second substrate part comprises a material having a greater breaking length than the first substrate part; and
the second substrate part comprises cutouts.

16. An optical arrangement, comprising:
a movable component having a side;
a first actuator configured to move the movable component a first stop comprising a first stop face configured to delimit movement of the movable component in a movement direction, the optical arrangement;
a second actuator configured to cause relative movement between the first stop and the movable component; and
a distance sensor configured to determine a distance between the movable component and of the first stop face.

17. The optical arrangement of claim 16, wherein the distance sensor is configured to contactlessly determine the distance.

18. The optical arrangement of claim 16, further comprising a closed-loop control device configured to control movement of the stop to a distance of less than five millimeters.

19. The optical arrangement of claim 16, wherein the second actuator comprises a member selected from the group consisting of a hydraulic actuator and a pneumatic actuator.

20. An optical arrangement, comprising:
a movable component having a side;
a first actuator configured to move the movable component; and
a first stop comprising a first stop face configured to delimit movement of the movable component in a movement direction,
wherein:
the first stop comprises a membrane having a first side and second side different from the first side of the membrane;
the first stop face is on the first side of the membrane;
a space adjoins the second side of the membrane;
the space is sealed off from an environment;
the space is configured so that a fluid is able to enter the space to change a curvature of the membrane.

* * * * *

UNITED STATES PATENT AND TRADEMARK OFFICE
CERTIFICATE OF CORRECTION

PATENT NO. : 10,809,636 B2
APPLICATION NO. : 16/513201
DATED : October 20, 2020
INVENTOR(S) : Bernhard Gellrich et al.

It is certified that error appears in the above-identified patent and that said Letters Patent is hereby corrected as shown below:

In the Specification

Column 6, Line 44, delete "p," and insert -- $\rho$, --;

In the Claims

Column 14, Line 58, Claim 9, delete "top" and insert -- stop --;

Column 15, Lines 30-31, Claim 16, delete "component" and insert -- component; --;

Column 16, Line 4, Claim 16, after "and" delete "of".

Signed and Sealed this
Fifteenth Day of December, 2020

Andrei Iancu
*Director of the United States Patent and Trademark Office*